(12) United States Patent
Chanemougame et al.

(10) Patent No.: US 12,237,333 B2
(45) Date of Patent: Feb. 25, 2025

(54) POWER WALL INTEGRATION FOR MULTIPLE STACKED DEVICES

(71) Applicant: Tokyo Electron Limited, Tokyo (JP)

(72) Inventors: Daniel Chanemougame, Niskayuna, NY (US); Lars Liebmann, Halfmoon, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 670 days.

(21) Appl. No.: 17/222,495

(22) Filed: Apr. 5, 2021

(65) Prior Publication Data

US 2022/0068921 A1 Mar. 3, 2022

Related U.S. Application Data

(60) Provisional application No. 63/073,048, filed on Sep. 1, 2020.

(51) Int. Cl.
*H01L 27/092* (2006.01)
*H01L 21/02* (2006.01)
(Continued)

(52) U.S. Cl.
CPC .... *H01L 27/0922* (2013.01); *H01L 21/02603* (2013.01); *H01L 21/28123* (2013.01); *H01L 21/823807* (2013.01); *H01L 21/823814* (2013.01); *H01L 21/823828* (2013.01); *H01L 21/823871* (2013.01); *H01L 23/5286* (2013.01);
(Continued)

(58) Field of Classification Search
CPC ......... H01L 29/78696; H01L 29/78618; H01L 29/42392; H01L 29/41733; H01L 29/0673; H01L 23/5286; H01L 21/823871; H01L 21/823828; H01L 21/823814; H01L 21/823807; H01L 21/28123; H01L 21/02603; H01L 27/0922

See application file for complete search history.

(56) References Cited

U.S. PATENT DOCUMENTS 9,997,598 B2  6/2018  Smith et al.
10,192,867 B1  1/2019  Frougier et al.
(Continued)

OTHER PUBLICATIONS

International Search Report and Written Opinion issued Dec. 16, 2021 in PCT/US2021/047597, 8 pages.
(Continued)

*Primary Examiner* — Ratisha Mehta

(57) ABSTRACT

A first transistor tier is formed over a substrate, positioned in a first tier of the semiconductor device and includes bottom transistors extending along a horizontal direction parallel to the substrate. A first segment of a first conductive plane is formed in the first tier and adjacent to a first side of the first transistor tier, spans a height of the first transistor tier, and is connected to the first transistor tier. A second transistor tier is formed over the first transistor tier, positioned in a second tier of the semiconductor device and includes top transistors extending along the horizontal direction. A second segment of the first conductive plane is formed in the second tier and adjacent to a first side of the second transistor tier, positioned over and connected to the first segment of the first conductive plane, and spans a height of the second transistor tier.

6 Claims, 9 Drawing Sheets

(51) Int. Cl.
*H01L 21/28* (2006.01)
*H01L 21/8238* (2006.01)
*H01L 23/528* (2006.01)
*H01L 29/06* (2006.01)
*H01L 29/417* (2006.01)
*H01L 29/423* (2006.01)
*H01L 29/786* (2006.01)

(52) U.S. Cl.
CPC .... *H01L 29/0673* (2013.01); *H01L 29/41733* (2013.01); *H01L 29/42392* (2013.01); *H01L 29/78618* (2013.01); *H01L 29/78696* (2013.01)

(56) References Cited

U.S. PATENT DOCUMENTS

| | | | |
|---|---|---|---|
| 10,236,292 B1 | 3/2019 | Frougier et al. |
| 10,304,832 B1 | 5/2019 | Chanemougame et al. |
| 10,381,438 B2 | 8/2019 | Zhang et al. |
| 10,453,850 B2 | 10/2019 | Smith et al. |
| 10,529,830 B2 | 1/2020 | Tapily et al. |
| 10,573,655 B2 | 2/2020 | Smith et al. |
| 10,879,352 B2 | 12/2020 | Zhang et al. |
| 10,930,764 B2 | 2/2021 | Tapily et al. |
| 10,964,706 B2 | 3/2021 | Smith et al. |
| 2018/0026042 A1 | 1/2018 | Smith et al. |
| 2018/0040695 A1 | 2/2018 | Smith et al. |
| 2018/0047832 A1 | 2/2018 | Tapily et al. |
| 2018/0240802 A1 | 8/2018 | Smith et al. |
| 2019/0131396 A1 | 5/2019 | Zhang et al. |
| 2019/0148376 A1 | 5/2019 | Chanemougame et al. |
| 2019/0319095 A1 | 10/2019 | Zhang et al. |
| 2019/0326301 A1 | 10/2019 | Smith et al. |
| 2020/0035683 A1 | 1/2020 | Sharma et al. |
| 2020/0075574 A1 | 3/2020 | Smith et al. |
| 2020/0098897 A1 | 3/2020 | Tapily et al. |
| 2021/0151438 A1* | 5/2021 | Gomes ................ H01L 23/5226 |

OTHER PUBLICATIONS

Taiwanese Intellectual Property Office, Notification of Examination Opinions for Taiwanese Application No. 110132219, dated Aug. 28, 2024, 12 pages.

* cited by examiner

POWER WALL INTEGRATION FOR MULTIPLE STACKED DEVICES

CROSS REFERENCE TO RELATED APPLICATIONS

This present application claims the benefit of priority to U.S. Provisional Application No. 63/073,048 filed on Sep. 1, 2020, which is incorporated by reference herein in its entirety.

FIELD OF THE INVENTION

The disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators are actively researching paths that exploit the vertical dimension to achieve three-dimensional (3D) semiconductor circuits and re-invent scaling.

SUMMARY

Techniques herein provide device architectures and process methods that help enable 3D scaling of transistors. Such techniques provide a power-wall structure to support monolithically integrated 3D logic or memory devices. Such design enables power to be drawn at all levels throughout a device stack. Power can be fed into vertical power-walls from either above (as in conventional power delivery networks), or from below through buried power-rails. Such buried power-rails (or conventional top down power distribution network (PDN)) can be configured to run either parallel to the vertical power-walls or perpendicular to the vertical power-walls. Such structures can be used for logic or memory devices. Power wall formation herein is executed by step-wise formation at each vertical device tier such that local interconnects and corresponding power wall sections are formed simultaneously.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a method of forming a semiconductor device is provided. In the method, a first transistor tier can be formed over a substrate and positioned in a first tier of the semiconductor device. The first transistor tier can include bottom transistors that are arranged along a horizontal direction parallel to the substrate. A first bottom transistor of the bottom transistors can include a first bottom source/drain (S/D) region, a first bottom gate structure, and a second bottom S/D region that are arranged along the horizontal direction. A first segment of a first conductive plane can be formed adjacent to a first side of the first transistor tier. The first segment of the first conductive plane can be positioned over the substrate and disposed in the first tier, span a height of the first transistor tier, and connected to one of the first bottom S/D region and the second bottom S/D region of the first bottom transistor of the bottom transistors. Further, a second transistor tier can be formed over the first transistor tier. The second transistor tier can be disposed in a second tier of the semiconductor device and include top transistors that are arranged along the horizontal direction. A first top transistor of the top transistors can include a first top S/D region, a first top gate structure, and a second top S/D region that are arranged along the horizontal direction. A second segment of the first conductive plane can subsequently be formed in the second tier and adjacent to a first side of the second transistor tier, where the second segment of the first conductive plane can be positioned over the first segment of the first conductive plane in a vertical direction perpendicular to the substrate, and span a height of the second transistor tier.

In the method, a first segment of a second conductive plane can be formed in the first tier and be adjacent to a second side of the first transistor tier that is opposite to the first side of the first transistor tier. The first segment of the second conductive plane can span the height of the first transistor tier. A second segment of the second conductive plane can be formed in the second tier and adjacent to a second side of the second transistor tier that is opposite to the first side of the second transistor tier. The second segment of the second conductive plane can be positioned over the first segment of the second conductive plane in the vertical direction, span the height of the second transistor tier, and connected to one of the first top S/D region and the second top S/D region of the first top transistor of the top transistors. The first transistor tier and the second transistor tier can be arranged between the first conductive plane and the second conductive plane.

In some embodiments, a first bottom S/D local interconnect can be formed to be connected to the first bottom S/D region of the first bottom transistor of the bottom transistors. A second bottom S/D local interconnect can be formed to be connected to the second bottom S/D region of the first bottom transistor of the bottom transistors. One of the first bottom S/D local interconnect and the second bottom S/D local interconnect can be in contact with the first segment of the first conductive plane. Accordingly, the first segment of the first conductive plane can be connected to the one of the first bottom S/D region and the second bottom S/D region of the first bottom transistor through the one of the first bottom S/D local interconnect and the second bottom S/D local interconnect.

In some embodiments, a first top S/D local interconnect can be formed to be connected to the first top S/D region of the first top transistor of the top transistors. A second top S/D local interconnect can be formed to be connected to the second top S/D region of the first top transistor of the top transistors. One of the first top S/D local interconnect and the second top S/D local interconnect can be in contact with the second segment of the second conductive plane. Thus, the second segment of the second conductive plane can be connected to the one of the first top S/D region and the second top S/D region of the first top transistor through the one of the first top S/D local interconnect and the second top S/D local interconnect.

In the method, a first bottom channel region of the first bottom transistor can be formed. In addition, a first top channel region of the first top transistor can be formed to be disposed over the first bottom channel region. The first bottom channel region can be arranged between the first bottom S/D region and the second bottom S/D region of the first bottom transistor. The first top channel region can be arranged between the first top S/D region and the second top S/D region of the first top transistor. Further, the first bottom gate structure can be formed to surround the first bottom channel region, and the first top gate structure can be formed to surround the first top channel region.

In some embodiments, the first bottom channel region can include one of a nano-sheet or a nanowire that extends along the horizontal direction, and the first top channel region can include one of a nano-sheet or a nanowire that extends along the horizontal direction.

In some embodiments, a second bottom transistor of the bottom transistors can be formed, which can be positioned adjacent to the first bottom transistor. The second bottom transistor can include a third bottom S/D region, a second bottom gate structure, and a fourth bottom S/D region that are disposed sequentially along the horizontal direction and connected to each other. The fourth bottom S/D region of the second bottom transistor can be in contact with the first bottom S/D region of the first bottom transistor.

In some embodiments, a second top transistor of the top transistors that is positioned adjacent to the first top transistor can be formed. The second top transistor can include a third top S/D region, a second top gate structure, and a fourth top S/D region that are disposed sequentially along the horizontal direction and connected to each other. The fourth top S/D region of the second top transistor can be in contact with the first top S/D region of the first top transistor.

In the method, the first top transistor can be positioned over the first bottom transistor to form a first transistor pair, and the second top transistor can be positioned over the second bottom transistor to form a second transistor pair.

In an embodiment, the first bottom transistor and the second bottom transistor can be n-type transistors, and the first top transistor and the second top transistor can be p-type transistors.

In another embodiment, the first bottom transistor and the second bottom transistor can be p-type transistors, and the first top transistor and the second top transistor can be n-type transistors.

In the method, a first interface layer can be formed between the first segment and the second segment of the first conductive plane so that the first segment and the second segment of the first conductive plane are connected to one another. A second interface layer can be formed between the first segment and the second segment of the second conductive plane so that the first segment and the second segment of the second conductive plane can be connected to one another.

In an embodiment, a cutting process can be performed on bottom gate structures of the first transistor tier that include the first bottom gate structure and the second bottom gate structure, and top gate structures of the second transistor tier that include the first top gate structure and the second top gate structure prior to the forming the first and the second segments of the first conductive plane and the first and the second segments of the second conductive plane. Accordingly, the first conductive plane can have a continuous profile that extends along the first side of the first transistor tier and the first side of the second transistor tier. The second conductive plane can have a continuous profile that extends along the second side of the first transistor tier and the second side of the second transistor tier.

In another embodiment, the first conductive plane and the second conductive plane are formed with the first transistor tier and the second transistor tier. A cutting process can be subsequently performed on bottom gate structures of the first transistor tier that include the first bottom gate structure and the second bottom gate structure, and top gate structures of the second transistor tier that include the first top gate structure and the second top gate structure after the formation of the first conductive plane and the second conductive plane. Thus, the first conductive plane can have a discontinuous profile in that the first conductive plane is positioned at the first side of the first transistor tier and the first side of the second transistor tier and disposed between the bottom gate structures of the first transistor tier and the top gate structures of the second transistor tier. The second conductive plane can have a discontinuous profile in that the second conductive plane is positioned at the second side of the first transistor tier and the second side of the second transistor tier and disposed between the bottom gate structures of the first transistor tier and the top gate structures of the second transistor tier.

According to another aspect of the disclosure, a semiconductor device is provided. The semiconductor device can include a first transistor tier over a substrate. The first transistor tier can be positioned in a first tier of the semiconductor device and include bottom transistors that are arranged along a horizontal direction parallel to the substrate. A first bottom transistor of the bottom transistors can include a first bottom source/drain (S/D) region, a first bottom gate structure, and a second bottom S/D region that are arranged along the horizontal direction. The semiconductor device can include a first segment of a first conductive plane adjacent to a first side of the first transistor tier. The first segment of the first conductive plane can be positioned over the substrate and disposed in the first tier, span a height of the first transistor tier, and connected to one of the first bottom S/D region and the second bottom S/D region of the first bottom transistor of the bottom transistors. The semiconductor device can include a second transistor tier over the first transistor tier, where the second transistor tier can be disposed in a second tier of the semiconductor device and include top transistors that are arranged along the horizontal direction. A first top transistor of the top transistors can include a first top S/D region, a first top gate structure, and a second top S/D region that are arranged along the horizontal direction. The semiconductor device can further include a second segment of the first conductive plane adjacent to a first side of the second transistor tier and in the second tier, where the second segment of the first conductive plane can be positioned over the first segment of the first conductive plane in a vertical direction perpendicular to the substrate, span a height of the second transistor tier.

The semiconductor device can include a first segment of a second conductive plane in the first tier, which can be adjacent to a second side of the first transistor tier that is opposite to the first side of the first transistor tier. The first segment of the second conductive plane can span the height of the first transistor tier. The semiconductor device can include a second segment of the second conductive plane in the second tier, which can be adjacent to a second side of the second transistor tier that is opposite to the first side of the second transistor tier. The second segment of the second conductive plane can be positioned over the first segment of the second conductive plane in the vertical direction, span the height of the second transistor tier, and connected to one of the first top S/D region and the second top S/D region of the first top transistor of the top transistors. The first transistor tier and the second transistor tier can be arranged between the first conductive plane and the second conductive plane.

In some embodiments, the semiconductor device can have a first bottom S/D local interconnect that is connected to the first bottom S/D region of the first bottom transistor of the bottom transistors, and a second bottom S/D local interconnect that is connected to the second bottom S/D region of the first bottom transistor of the bottom transistors. One of the first bottom S/D local interconnect and the second bottom S/D local interconnect can be in contact with the first segment of the first conductive plane. Thus, the first segment of the first conductive plane can be connected to the one of the first bottom S/D region and the second bottom S/D region of the first bottom transistor through the one of the first bottom S/D local interconnect and the second bottom S/D local interconnect.

The semiconductor device can further include a first top S/D local interconnect that is connected to the first top S/D region of the first top transistor of the top transistors, and a second top S/D local interconnect that is connected to the second top S/D region of the first top transistor of the top transistors. One of the first top S/D local interconnect and the second top S/D local interconnect can be in contact with the second segment of the second conductive plane. Accordingly, the second segment of the second conductive plane can be connected to the one of the first top S/D region and the second top S/D region of the first top transistor through the one of the first top S/D local interconnect and the second top S/D local interconnect.

In an embodiment, the first conductive plane can have a continuous profile that extends in a direction parallel to the first side of the first transistor tier and the first side of the second transistor tier. The second conductive plane can have a continuous profile that extends in a direction parallel to the second side of the first transistor tier and the second side of the second transistor tier.

In another embodiment, the first conductive plane can have a discontinuous profile in that the first conductive plane is positioned between gate structures of the first transistor tier and the second transistor tier. The second conductive plane can have a discontinuous profile in that the second conductive plane is positioned between the gate structures of the first transistor tier and the second transistor tier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
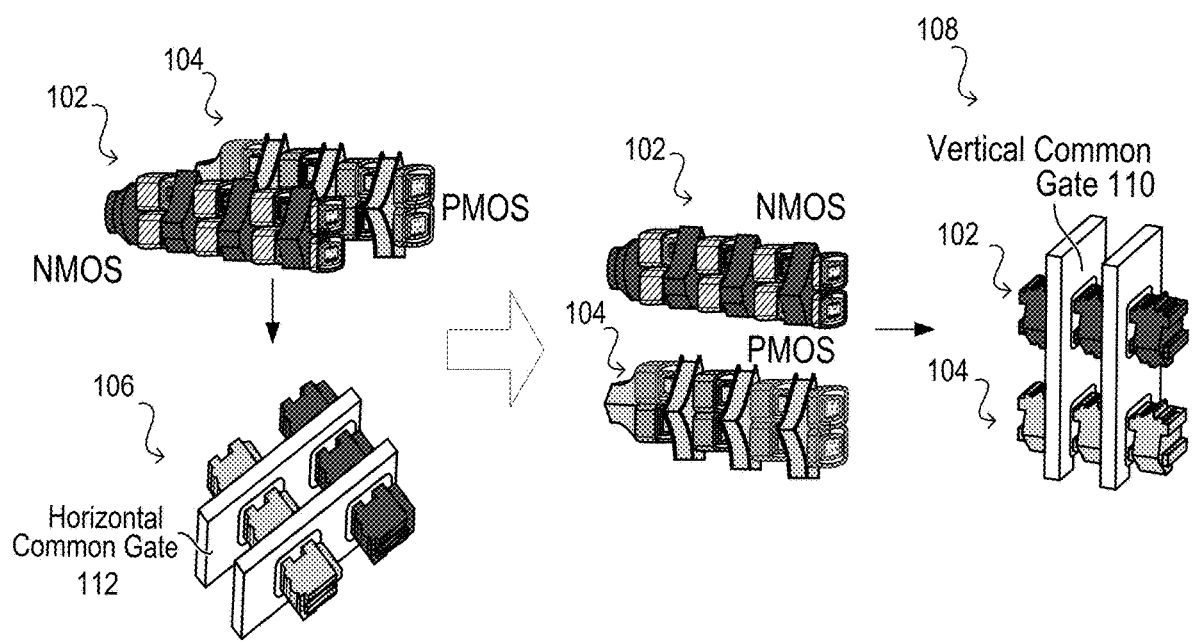
FIG. 1 is a basic representation of how conventional side by side CMOS devices are instead vertically stacked to form a vertical stack of 2 devices, in what is called a complementary FET (CFET).

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

The semiconductor industry is transitioning to a new device architecture. The new device architecture can include a transition from finFET to Lateral Gate-All-Around nanosheet (LGAA NS) transistors, among other 3D architectures. The complementary FET device architecture, or CFET, is a strong focus in research. Complementary FET devices (CFET) are three-dimensionally stacked logic transistors in which either a NMOS or a PMOS transistor is situated overtop its complement. Such a configuration enables an area-scaling and routing congestion improvement for logic standard cells as well as SRAM memory cells. As shown in FIG. 1, a CFET device 108 includes stacking NMOS transistors 102 on top of PMOS (or vice versa) transistors 104 to take advantage of the vertical dimension and pursue better power, performance and area (PPA) scaling. The CFET architecture considered here is based on the LGAA NS device architecture, NS stacked on NS, and not finFET stacked on finFET.

As shown in FIG. 1 on the left, NMOS transistors 102 and PMOS transistors 104 in conventional technology (planar bulk and finFET) can be built and arranged side by side, on a same plane of a Si wafer to form a Complementary Metal Oxide Semiconductor (CMOS) device 106. Comparing to the CMOS device 106, the CFET device 108 takes advantage of the vertical dimension and stacks the NMOS transistors 102 on top of the PMOS transistors 104 (or vice versa). A vertical common gate 110 between NMOS transistors 102 and PMOS transistors 104 replaces a horizontal gate 112 running from NMOS transistors 102 to PMOS transistors 104 to make complementary functions of the CMOS device 106.

Figure 2:
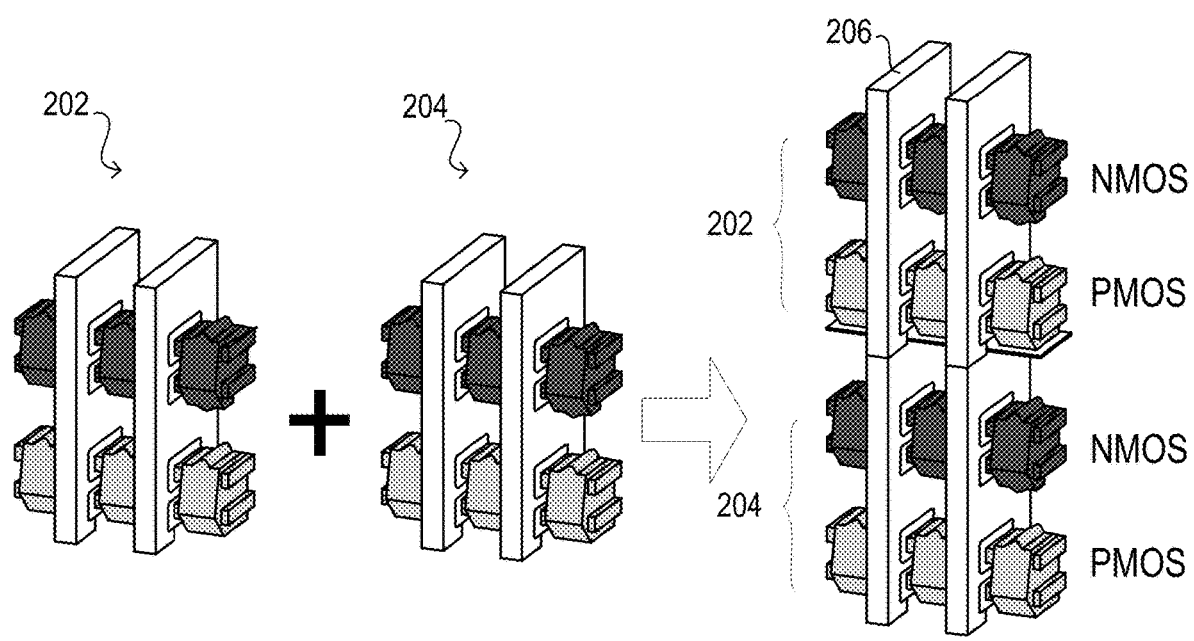
FIG. 2 is a basic representation of how 2 CFET devices are vertically stacked together forming a vertical stack of 4 transistors.

Stacking a CFET device on top of another CFET device can provide PPA benefits. Such compact 3D circuits can lead to fundamental changes in the way circuits are designed. FIG. 2 shows a simplified representation of CFET on CFET stacking. As shown in FIG. 2, a first CFET device 202 is stacked on a second CFET device 204. Some details can be seen such as the order of the stacked transistors (PMOS/NMOS/PMOS/NMOS from bottom to top), or the vertical gates 206 being common to all the stacked devices. Of course these specific details are exemplary and many combinations and structures are possible.

Stacking NMOS transistor on top of PMOS transistors (or vice versa) in a CFET device can have significant process and integration challenges. Stacking a CFET device on another CFET device can present even more challenges, in particular, how to connect each of the stacked devices to the power grid in an efficient and dense manner.

The present disclosure herein includes a structure that distributes power connections to multiple active devices, stacked on top of each other, without interfering with other devices and the local connections that are needed. Accordingly, the present disclosure can greatly advance the pursuit of highly stacked and integrated structure in 3D, to leverage the vertical dimension and enable further drastic improvements of CMOS circuit's power performance and area. Embodiments enable a structural conductor element to what the multiple stacked devices can conveniently connect laterally through the local interconnects.

Figure 3A:
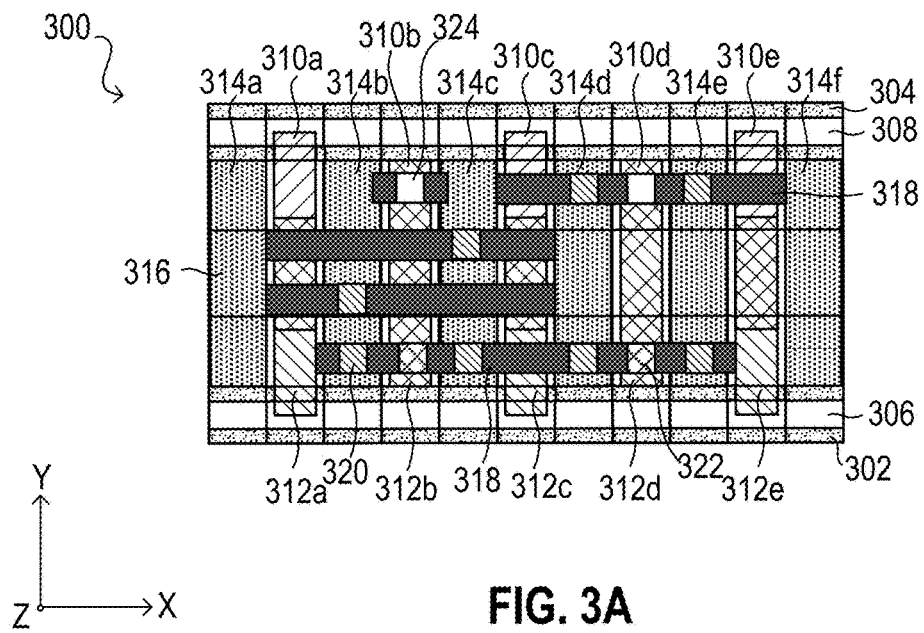
FIG. 3A is a schematic layout view of a semiconductor device formed based on stacked CFETs and power walls, in accordance with some embodiments.
Figure 3B:
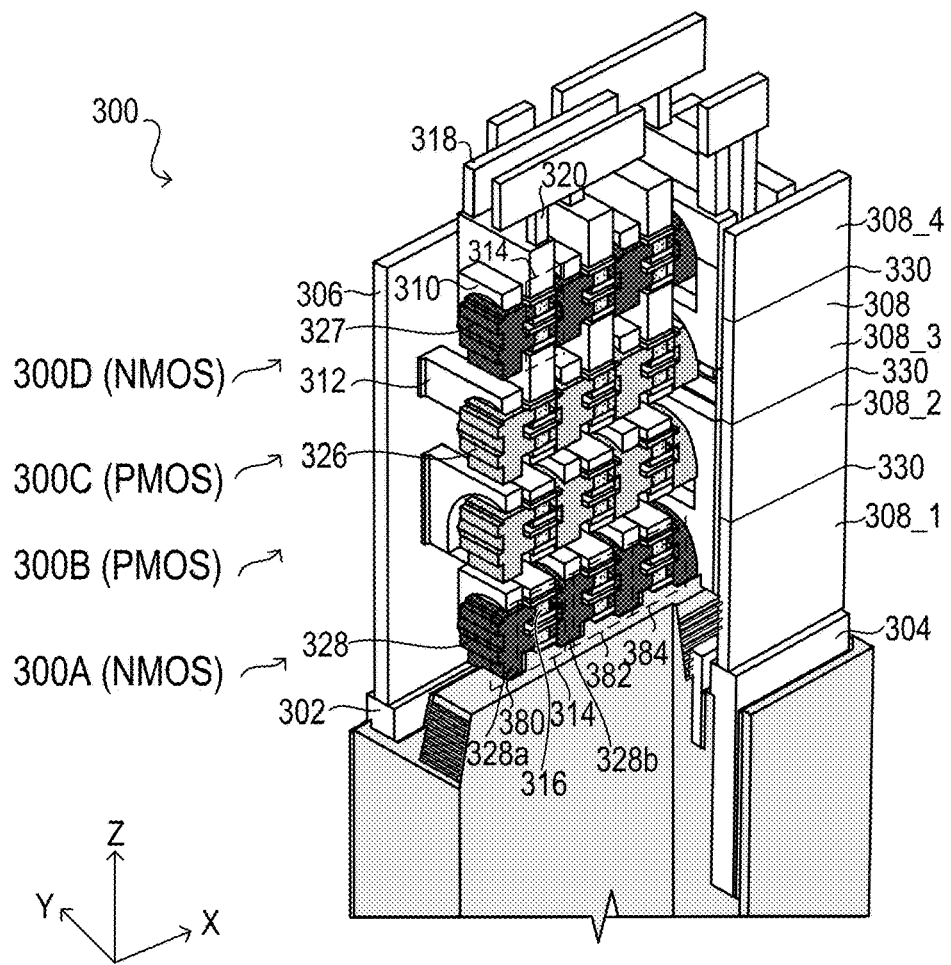
FIG. 3B is a perspective view of the corresponding semiconductor device formed based on stacked CFET and power walls, in accordance with some embodiments.

FIGS. 3A and 3B show a structure of a logic circuit 300 made with four stacked levels of transistors. The diagram shown in FIG. 3A is a top down view of the logic circuit 300, or layout representation. FIG. 3B is a perspective view showing a 3D view of the complex 3D structure of the logic circuit 300, where the power walls 306 and 308 are illustrated. In an embodiment of FIGS. 3A and 3B, a power grid is represented by a buried power rail (e.g., 302 or 304) as an example, but a more conventional power rail (like metal zero (M0) line) can alternatively be used. As can be appreciated, each device level (e.g., 300A-300D) can include one or more local interconnects (e.g. 310 or 312) that can be used to connect devices of the device level to the outside world or wiring structure.

As shown in FIG. 3A, the logic circuit 300 can include a first buried power rail 302 and a second buried power rail 304 that extend along a X direction. A first power wall 306 can be formed over and connected to the first buried power rail 302, and a second power wall 308 can be disposed over and connected to the second buried power rail 304. Device levels (also referred to as transistor tiers) 300A-300D can be positioned between the first power wall 306 and the second power wall 308, and further be connected to the first power wall 306 and the second power wall 308 through a plurality of local interconnects 310 and 312. As shown in FIG. 3A, the first power wall 306 and the second power wall 308 are basically conductive planes that are configured to provide power provided by the buried power rails (e.g., 302 and 304) to the device levels. In an exemplary embodiment of FIG. 3A, the local interconnects 310 are formed over n-type source/drain (S/D) regions (e.g., 327 in FIG. 3B of NMOS device levels (e.g., 300A or 300D). The local interconnects 312 are formed over p-type S/D regions (e.g., 326 in FIG. 3B) of PMOS device levels (e.g., 300B or 300C). Each of the device levels can further include a plurality of gate structures (e.g., 314) that are extend along a Y direction. The gate structures (e.g., 314) can further be arranged to surround channel regions (e.g., 316), which can be formed of nano-sheets or nanowires that extends along the X-direction.

In some embodiments, the buried power rails (e.g., 302 and 304) can be made of Cu, Co, Ru, W, or other conductive materials. The channel regions (e.g., 316) can be made of Si, SiGe, or other suitable semiconductor materials. The gate structures (e.g., 314) can include dielectric layers that surround the channel regions, and gate electrode that are positioned over the dielectric layers. The dielectric layers can include an interfacial oxide layer, such as SiO2, and a high-k layer, such as HfO2, Al2O3, Y2O3, ZrO2, or the like. The gate electrode can include a TiC layer, a TaN layer, a TiN layer, a TiON layer, or other suitable conductive layers. The p-type S/D regions (e.g., 324) can be made of silicon or silicon germanium doped with boron, and the n-type S/D regions (e.g., 326) can be made of silicon doped with phosphorous.

The logic circuit can include a plurality of metal lines 318 that are connected to the gate structures 314, and the local interconnects 312 and 310 through the gate contacts 320, the S/D contacts 322 and 324 of the logic circuit 300 respectively.

As shown in FIG. 3B, each of the device level can include a plurality of transistors that are arranged side by side and connected to each other, as is well known for one skilled in the art. For example, the NMOS transistor 380 can have a first n-type S/D region 328a, a n-type gate structure 314 that surrounds the channel region 316, and a second n-type S/D region 328b. In some embodiments, the channel region can include one or more nano-sheets or nanowires.

The power walls 306 and 308 can include a plurality of segments (or tiers), and each of the segments can span a height of a corresponding device level (or transistor tier). For example, the power wall 308 can include four segments 308_1, 308_2, 308_3 and 308_4. The first segment 308_1 can be positioned in a same plane as the device level (or transistor tier) 300A, and span a height of the device level 300A. The second segment 308_2 can be positioned in a same plane as the device level 300B, and span a height of the device level 300B. In some embodiments, interface layers 330 can be formed between the segments of the power wall so that the segments of the power wall can be connected to each other. In some embodiments, the interface layers 330 may not exist, and the segments of the power wall can be connected to each other.

In some embodiments, the first power wall 306 and the second power wall 308 can be made of Cu, Co, Ru, W, or other conductive materials. The interface layers 330 can include TiN, TaN, Ta, or other suitable barrier materials.

As shown in FIGS. 3A and 3B, the power walls (e.g., 306 and 308) can be centered and directly above the buried power rails (e.g., 302 and 304) and cover the full height of the four levels of transistors (or device levels, or transistor tiers) 300A-300D. Each of the device level can easily be connected to the power grid by laterally extending the respective local interconnects to the power walls.

The way the local interconnects (e.g., 310 or 312) extend to the power walls (e.g., 306 or 308) may seem straightforward on the layout shown in FIG. 3A. But to achieve such a structure through process and integration is in reality very challenging. Many different methods are possible, each leading to both process and electrical compromises.

Figures 4A, 4B:
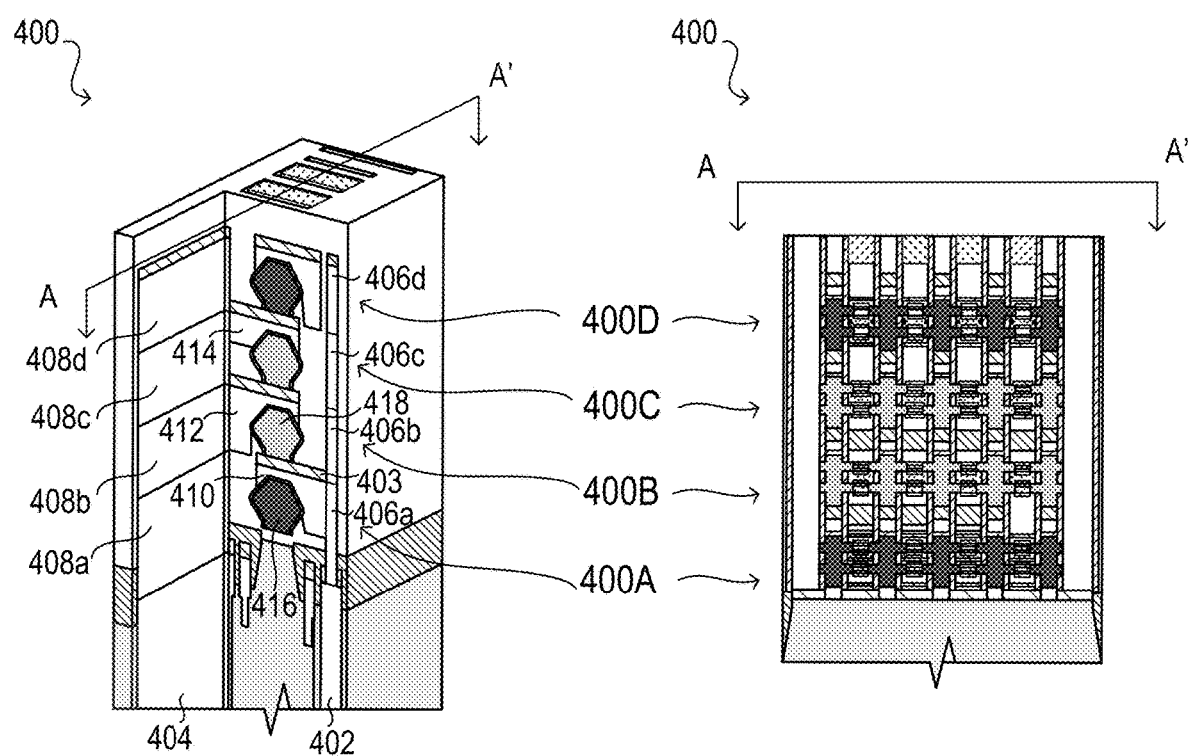
FIG. 4A is a perspective view of a semiconductor device formed based on stacked CFETs and power walls, in accordance with some embodiments.
FIG. 4B is a cross-sectional view of a semiconductor device formed based on stacked CFETs, in accordance with some embodiments.

FIGS. 4A-4F summarize challenges and qualities required for connections in a device 400. As shown in FIGS. 4A and 4B, each level or tier of transistors 400A-400B in device 400 can comprise multiple transistors, each of which can require access to the power. As can be appreciated, there is a level of complexity and proximity of the connections required. For example, the device 400 can include a first buried power rail 402 and a second buried power rail 404. A first power wall 406 is positioned over the first buried power rail 402, and a second power wall 408 is positioned over the second buried power rail 404. The first power wall 406 can include a plurality of segments, such as segments 406a-406d. The second power wall 408 can include a plurality of segments, such as segments 408a-408d. A n-type S/D region 416 in the transistor tier (or device tier, or device level) 400A can be connected to the segment 406a of the first power wall 406 through a local interconnect 410. A p-type S/D region 418 can be connected to the segment 408b of the second power wall 408 through a local interconnect 412. It should be noted that a respective dielectric cap layer can be formed over a corresponding local interconnect. For example, as shown in FIG. 4A, a dielectric cap layer 403 can be positioned over the local interconnect 410.

Figure 4C:
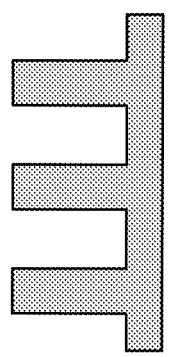
FIGS. 4C-4F are various methods of manufacturing power walls and corresponding connections to the power walls, in accordance with some embodiments.

To achieve connections, the power wall (vertical) and each local interconnect (horizontal) can be described with simple cross-sections on the pictures in FIGS. 4C-4F. The first case in FIG. 4C represents an ideal situation where seamless connections are established between power wall and local interconnects. With no interfaces present between the different elements, a very robust, low resistance contact is achieved.

Figure 4D:
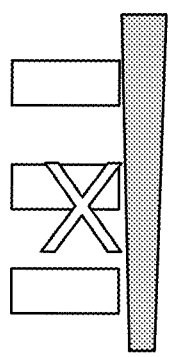

In the 2nd case illustrated in FIG. 4D, the power wall is formed first, before the different device tiers (or device levels, or transistor tiers) and their corresponding local interconnects. This technique is flawed because it adds challenges to form the device tiers, and does not ensure reliable contact formation as shown in the ideal case.

Figure 4E:
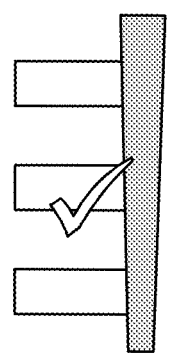
Figure 4F:
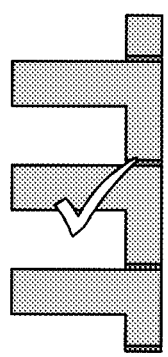

Embodiments herein include the two techniques in FIGS. 4E and 4F. In case 3 that is shown in FIG. 4E, the power wall is built after all the different device tiers and the local interconnects of the different device tiers are completed. The power wall pattern is transferred into the structure by a combination of dielectric and metal anisotropic etches. For example, the dielectric etch exposes (uncovers) the metal of the first (top) local interconnect in the line of sight. When the metal of the first (top) local interconnect is uncovered, it can be etched away, so the dielectric etch can resume until the metal of the next local interconnect is uncovered, and this process can continue. Once the trench is formed on the full height of the four transistor tiers, the power wall can be metallized. A contact with each local interconnect can have an interface (liner or barrier et cetera), but can form a consistent side connection. This technique also improves significantly the robustness of this contact with respect to variations. In particular, any edge placement error of the local interconnects is absorbed by the side connection, as long as the local interconnect edge is in the line of sight of the anisotropic etch.

One challenge is to form such a high aspect ratio trench (e.g., about 20 nm wide by 200 nm tall) with as little taper as possible so the bottom critical dimension (CD) of the trench in contact with the buried power rail is as similar as possible to the top CD of trench.

Case 4 embodiment illustrated in FIG. 4F herein essentially separates the power wall in as many tiers (or segments) as desired. In an example of FIG. 4F, with four device tiers as described herein, the power wall can be separated into four tiers as well. Each tier is formed together with a corresponding device tier and local interconnects of the corresponding device tier. As shown in FIG. 4F, four power wall tiers can be built on top of each other, positioned adjacent to a corresponding device tier, and connected to the corresponding device tier through local interconnects of the corresponding device tier. Each power wall tier can be much less challenging to form because the aspect ratios involved are more manageable. Also, each local interconnect can be formed and metallized together with the corresponding power wall tier, that is, there is no interface between each local interconnect and the corresponding power wall tier that is in contact with the respective local interconnect, though there is an interface (e.g., 330 in FIG. 3B) between each power wall tier.

Figure 5A:
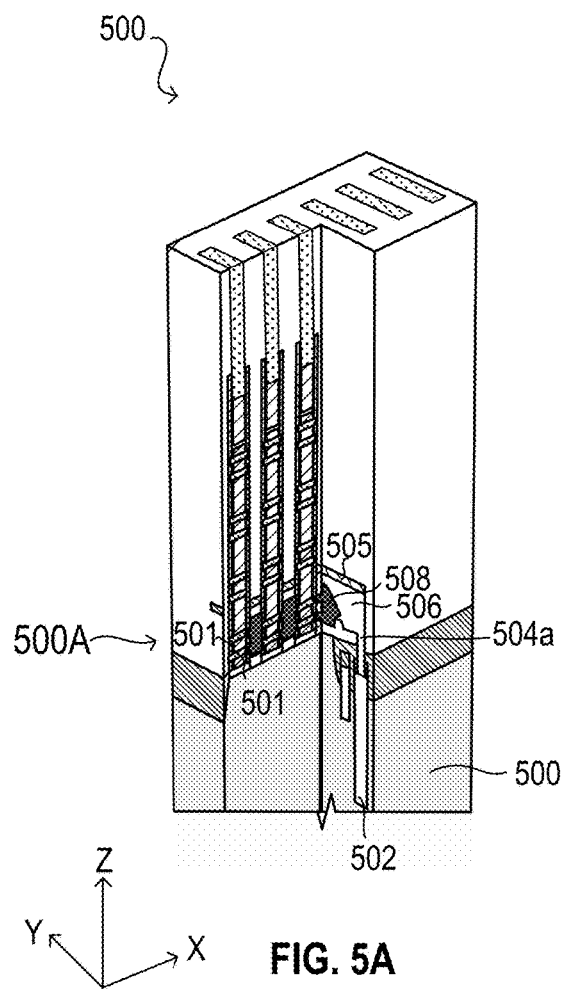
FIGS. 5A-5D are schematic views of intermediate steps of manufacturing power walls and corresponding connections to power walls, in accordance with some embodiments.

FIGS. 5A-5D illustrate a process flow describing the sequential formation of the power wall of case 4 of FIG. 4F, tier-by-tier, together with the device tier (or transistor tier) and local interconnect of the device tier. As shown in FIG. 5A, a first transistor tier 500A can be formed over a substrate 500 and extend a long a X-direction. A buried power rail 502 can be formed in the substrate 500 and extend along a X-Z plane. The first transistor tier 500A can include a plurality of transistors that are arranged side by side in the X-direction and connected to each other. Each of the transistors in the first transistor tier 500A can include a first S/D region, a gate structure, and a second S/region that are arranged along the X-direction and connected to each other. Each of the transistors in the first transistor tier 500A can include can further include a channel region (e.g., 501) that are formed of one or more nano-sheets or nanowires. Gate structures of the transistors in the first transistor tier 500A can be disposed to surround the channel regions. The first segment (or tier)

504a of a power wall 504 can be formed over and connected to the buried power rail 502. In addition, the first segment 504a of the power wall 504 can be connected to a S/D region (e.g., 508) through a local interconnect (e.g., 506), where the local interconnect 506 is formed over and connected to the S/D region 508.

It should be noted that the first segment 504a of the power wall 504 can be formed together with the first transistor tier 500A and expand a height of the first transistor tier 500A. For example, the first segment 504a of the power wall 504 can be metallized at a same time as metallizing the local interconnect 506. Thus, an interface layer or a barrier layer is not present between the first segment 504a of the power wall 504 and the local interconnect 506. Further, a dielectric cap layer 505 can be formed over the local interconnect 506 and configured to isolate the local interconnect 506 from adjacent structures.

In order to form the first transistor tier 500A and the first segment 504a of the power wall 504, various semiconductor manufacturing processes can be applied, as is well known by one skilled in the art. The semiconductor manufacturing processes can include a deposition process that can include a chemical vapor deposition (CVD), a physical vapor deposition (PVD). a sputtering, an epitaxial deposition, an atomic layer deposition (ALD), or the like. The semiconductor manufacturing processes can also include an etching process, such as a wet etching or a dry etching. The semiconductor process can further include a photolithographic process, an ion implantation process, a metrology process, an inline parametric characterization process, an inline defect characterization process, and so on.

Figure 5B:
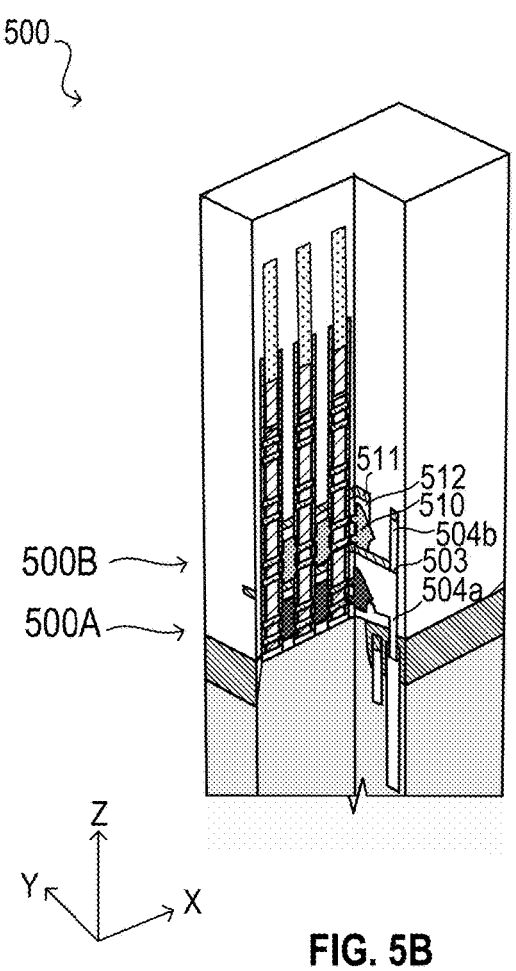

In FIG. 5B, a second transistor tier 500B and a second segment 504b of the power wall 504 can be formed. The second transistor tier 500B can be positioned over the first transistor tier 500A, and the second segment 504b can be disposed over the first segment 504a of the power wall 504. It should be noted that, in an embodiment of FIG. 5B, a local interconnect 512 that is formed over a S/D region 510 in the second transistor tier 500B is not in contact with the second segment 504b of the power wall 504 according to the circuit design. In addition, an interface layer 503 can be formed between the first segment 504a and the second segment 504b of the power wall 504. Further, a dielectric cap layer 511 can be formed over the local interconnect 512. The second segment 504b can span over a height of the second transistor tier 500B, and arranged in a same plane as the second transistor tier 500B.

Figure 5C:
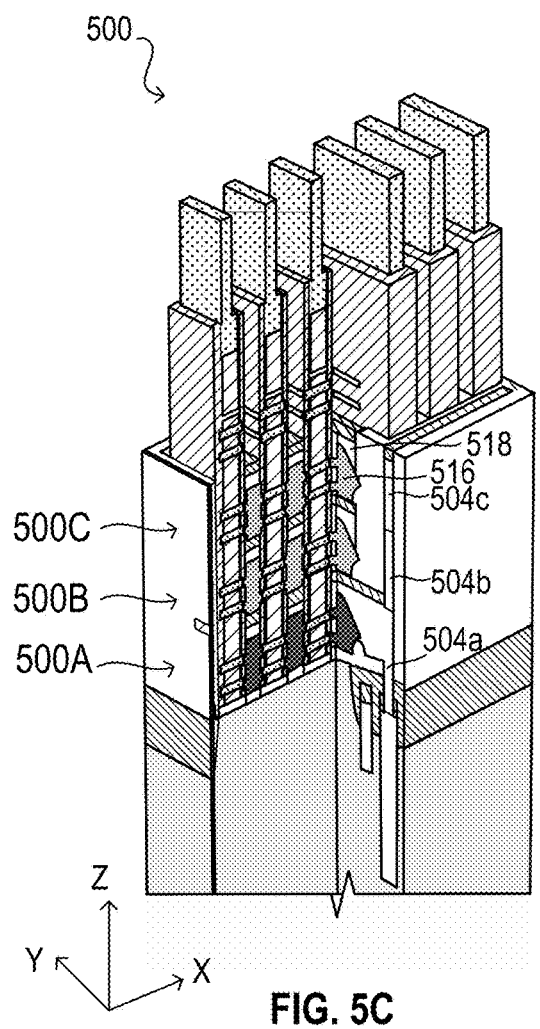
Figure 5D:
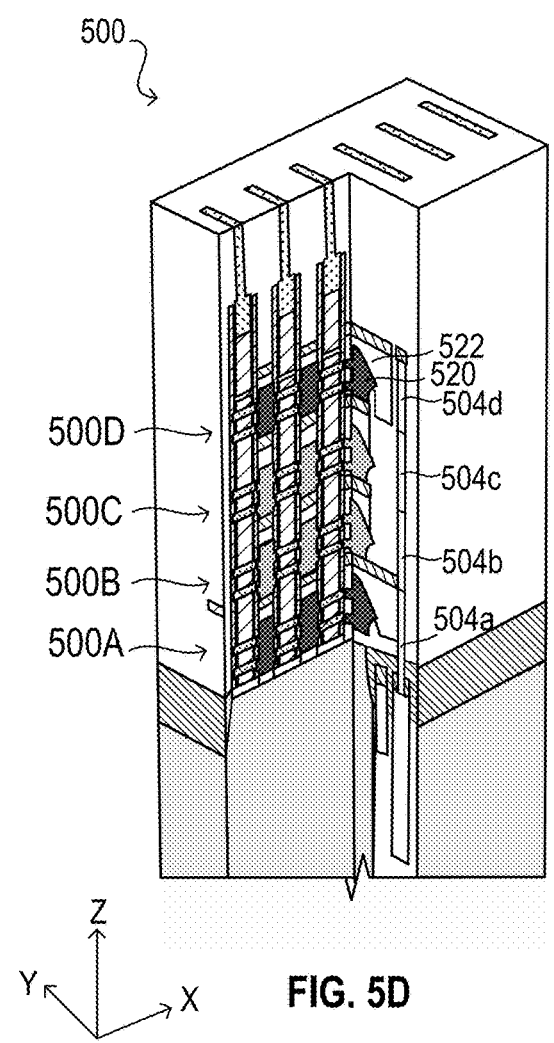

In FIG. 5C, a third transistor tier 500C can be formed over the second transistor tier 500B, and a third segment 504c can be formed over the second segment 504b of the power wall 504. In an embodiment of FIG. 5C, a local interconnect 518 that is formed over a S/D region 516 in the third transistor tier 500C is not in contact with the third segment 504c of the power wall 504. In FIG. 5D, a fourth transistor tier 500D can be formed over the third transistor tier 500C, and a fourth segment 504d can be formed over the third segment 504c of the power wall 504. In an embodiment of FIG. 5D, a local interconnect 522 that is formed over a S/D region 520 in the fourth transistor tier 500D. In this example, 522 is not in contact with the fourth segment 504d of the power wall 504, again in accordance with the circuit design.

Figure 6:
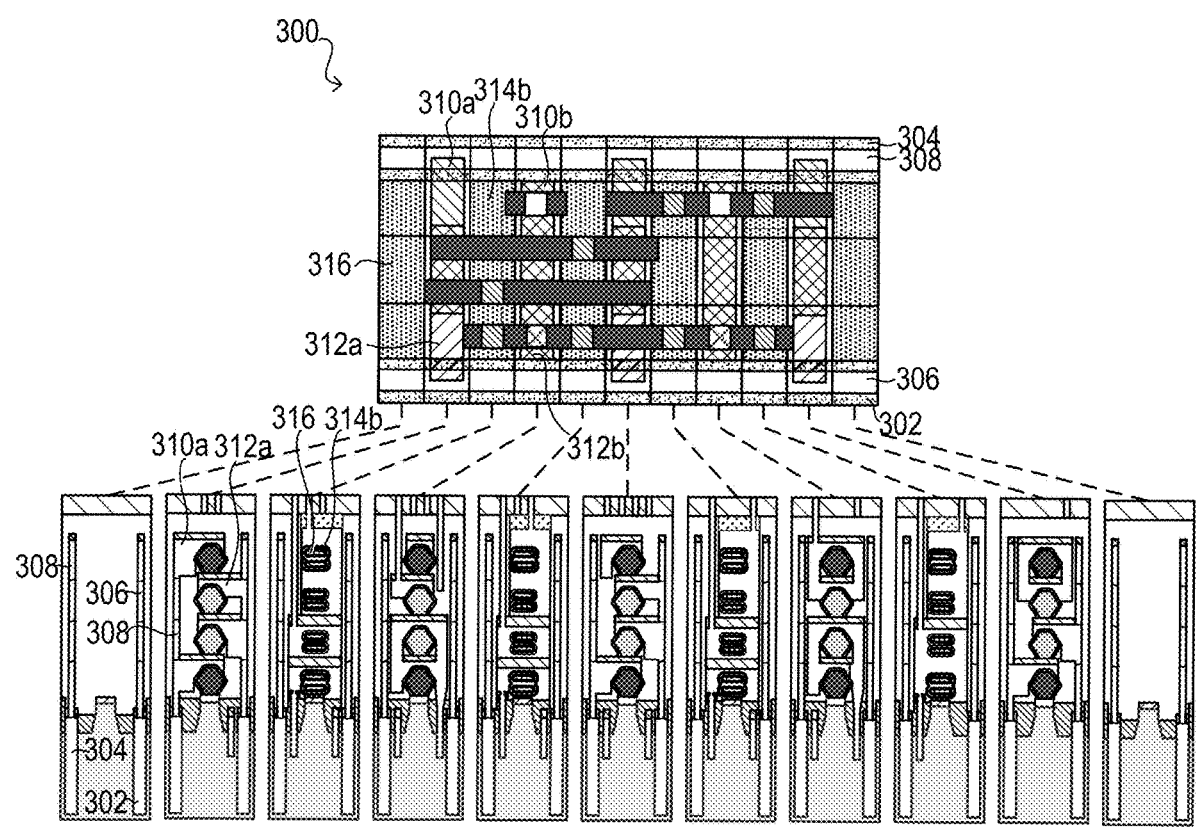
FIG. 6 is a schematic view of power wall connectivity, in accordance with some embodiments.

The final structures enabled by the power wall in a construct with four tiers of device and local interconnect stacked on top of each other can be summarized in FIG. 6 by showing the power wall connectivity. Starting from the example of layout view of a logic circuit 300 that is also presented in FIG. 3A, the final structures are illustrated by showing cross-sectional views of the layout for each gate structure and S/D locations (or regions). It can be seen that sometimes all devices in such S/D locations (e.g., 310a, 312a) are connected to the power walls (e.g., 306 and 308), or that sometimes none of the S/D locations (e.g., 310b and 312b) are connected to the power walls (e.g., 306 and 308), and every situation in between is possible, as dictated by the connectivity requirements of the logic circuit displayed here. Embodiments from both the case 3 in FIG. 4E and the case 4 in FIG. 4F can lead to such structures.

Figure 7:
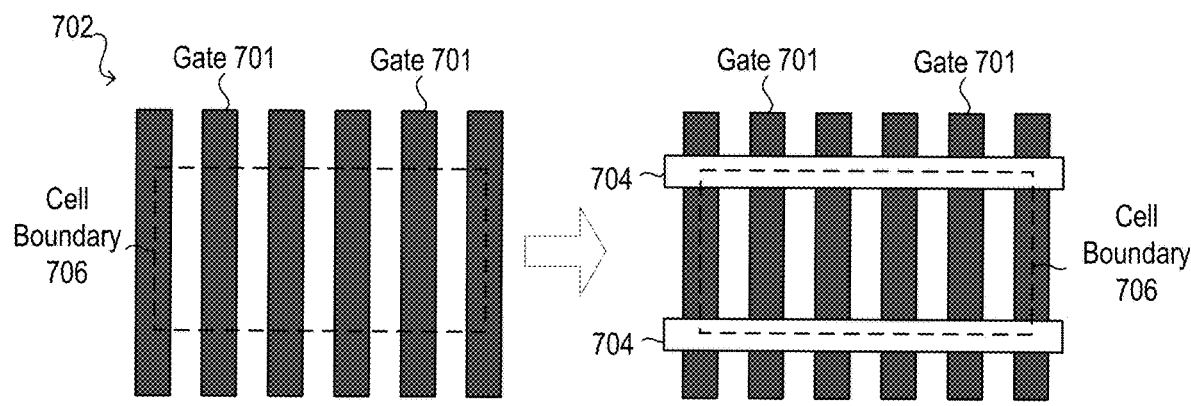
FIG. 7 is a schematic layout of a gate cut structure, in accordance with some embodiments.

Another embodiment of the disclosure relates to a way in which a power wall is formed but also how a final structure of the power wall is impacted. As shown in FIG. 7, on the left, in a typical layout 702, gates 701 can extend all the way to the boundary of the cell 706, i.e., gates 701 are continuous running from one cell to other cells directly above or below. Due to the manufacturing process at the relatively small dimensions of modern technologies, gates 701 are formed to be continuous. However, as is well known for one skilled in the art, after these continuous gates 701 are formed, the gates 701 need to be interrupted or cut in a subsequent process. The cut shape is typically a long horizontal shape 704, located at the cell boundary 706, as illustrated in FIG. 7 on the right.

Figure 8A:
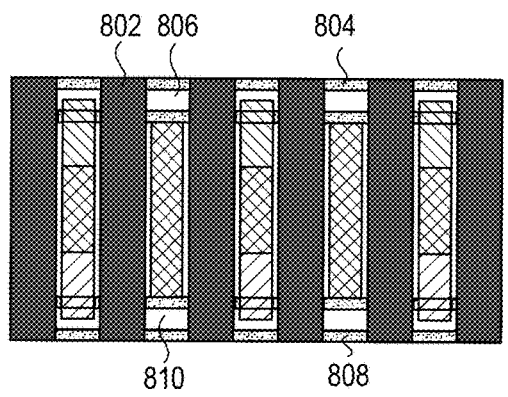
FIG. 8A is a schematic layout of a semiconductor device with a discontinuous power wall, in accordance with some embodiments.
Figure 8B:
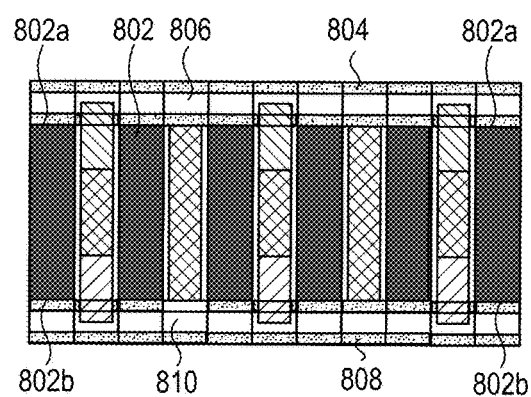
FIG. 8B is a schematic layout of a semiconductor device with a continuous power wall, in accordance with some embodiments.

FIGS. 8A and 8B show implications of the gate cut technique for the power wall. As can be seen on FIG. 8A, if the gates are not cut before the power wall is formed, the power wall will be formed in manner self-aligned to the gates and up discontinuous (804, 806) as is well understood by one skilled in the art. The gates (e.g., 802) are in the way of the power wall (e.g., 806 or 810) because the gates and the power wall share a same plane. It should be noted that a discontinuous power wall is functional. In another embodiment, the gates can be cut before the formation of the power wall, leading to a continuous power wall, as indicated by FIG. 8B.

As shown in FIG. 8B, the power wall 806 can have a continuous profile that extends in a direction parallel to first sides 802a of gates 802. The power wall 810 can have a continuous profile that extends in a direction parallel to second sides 802b of gates 802.

Another alternative is not taking the action to operate the gate cut before the formation of the local interconnects of the lowest device tier. Thus, the gates are still present at the cell boundary. The power wall can be formed self-aligned to the gates, that is, only in the S/D regions to which the power wall is connected. Accordingly, a discontinuous power wall can be formed that is interrupted by the gates, which can be shown in FIG. 8A. As shown in FIG. 8A, the power wall 806 or 810 is disposed between the gates 802. In an embodiment of FIG. 8A, the discontinuous power wall can be enabled by leveraging the self-alignment provided by the gates. Compared to the continuous power wall in FIG. 8B, there may be overall resistance penalties, but there would also be lower parasitic capacitances because there would be no power wall directly facing the side of the active gates 802. Thus, the discontinuous power wall can be combined with embodiments in case 3 and case 4 as well.

The various embodiments described herein offer several advantages over related techniques. The power wall is a key to leverage 3D and build complex, multi-stacked logic structure. By introducing a power wall that include segments, where each of the segments is formed with a corresponding device tier and spans a height of the corresponding device tier, stacking a CFET on top of another CFET with very dense designs can be enabled.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a first transistor tier over a substrate, the first transistor tier being positioned in a first tier of the semiconductor device and including bottom transistors that are arranged along a horizontal direction parallel to the substrate, a first bottom transistor of the bottom transistors including a first bottom source/drain (S/D) region, a first bottom gate structure, and a second bottom S/D region that are arranged along the horizontal direction;
a first segment of a first conductive plane adjacent to a first side of the first transistor tier, the first segment of the first conductive plane being positioned over the substrate and disposed in the first tier, spanning a height of the first transistor tier, and connected to one of the first bottom S/D region and the second bottom S/D region of the first bottom transistor of the bottom transistors;
a second transistor tier over the first transistor tier, the second transistor tier being disposed in a second tier of the semiconductor device and including top transistors that are arranged along the horizontal direction, a first top transistor of the top transistors including a first top S/D region, a first top gate structure, and a second top S/D region that are arranged along the horizontal direction and; and
a second segment of the first conductive plane adjacent to a first side of the second transistor tier and in the second tier, the second segment of the first conductive plane being positioned over and connected to the first segment of the first conductive plane, and spanning a height of the second transistor tier.

2. The semiconductor device of claim 1, further comprising:
a first segment of a second conductive plane positioned in the first tier and adjacent to a second side of the first transistor tier that is opposite to the first side of the first transistor tier, the first segment of the second conductive plane spanning the height of the first transistor tier; and
a second segment of the second conductive plane in the second tier and adjacent to a second side of the second transistor tier that is opposite to the first side of the second transistor tier, the second segment of the second conductive plane being positioned over the first segment of the second conductive plane, spanning the height of the second transistor tier, and connected to one of the first top S/D region and the second top S/D region of the first top transistor of the top transistors, wherein:
the first transistor tier and the second transistor tier are arranged between the first conductive plane and the second conductive plane.

3. The semiconductor device of claim 2, further comprising:
a first bottom S/D local interconnect that is connected to the first bottom S/D region of the first bottom transistor of the bottom transistors, and
a second bottom S/D local interconnect that is connected to the second bottom S/D region of the first bottom transistor of the bottom transistors, wherein:
one of the first bottom S/D local interconnect and the second bottom S/D local interconnect is in contact with the first segment of the first conductive plane so that the first segment of the first conductive plane is connected to the one of the first bottom S/D region and the second bottom S/D region of the first bottom transistor through the one of the first bottom S/D local interconnect and the second bottom S/D local interconnect.

4. The semiconductor device of claim 3, further comprising:
a first top S/D local interconnect that is connected to the first top S/D region of the first top transistor of the top transistors; and
a second top S/D local interconnect that is connected to the second top S/D region of the first top transistor of the top transistors, wherein:
one of the first top S/D local interconnect and the second top S/D local interconnect is in contact with the second segment of the second conductive plane so that the second segment of the second conductive plane is connected to the one of the first top S/D region and the second top S/D region of the first top transistor through the one of the first top S/D local interconnect and the second top S/D local interconnect.

5. The semiconductor device of claim 4, wherein:
the first conductive plane has a continuous profile that extends along the first side of the first transistor tier and the first side of the second transistor tier, and
the second conductive plane has a continuous profile that extends along the second side of the first transistor tier and the second side of the second transistor tier.

6. The semiconductor device of claim 4, wherein:
the first conductive plane has a discontinuous profile in that the first conductive plane is positioned at the first side of the first transistor tier and the first side of the second transistor tier and disposed between gate structures of the first transistor tier and the second transistor tier, and
the second conductive plane has a discontinuous profile in that the second conductive plane is positioned at the second side of the first transistor tier and the second side of the second transistor tier and disposed between the gate structures of the first transistor tier and the second transistor tier.

* * * * *